(12) United States Patent
Seddon et al.

(10) Patent No.: US 10,896,815 B2
(45) Date of Patent: Jan. 19, 2021

(54) SEMICONDUCTOR SUBSTRATE SINGULATION SYSTEMS AND RELATED METHODS

(71) Applicant: SEMICONDUCTOR COMPONENTS INDUSTRIES, LLC, Phoenix, AZ (US)

(72) Inventors: Michael J. Seddon, Gilbert, AZ (US); Thomas Neyer, Munich (DE); Fredrik Allerstam, Solna (SE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 119 days.

(21) Appl. No.: 15/986,403

(22) Filed: May 22, 2018

(65) Prior Publication Data
US 2019/0362960 A1    Nov. 28, 2019

(51) Int. Cl.
*H01L 21/02* (2006.01)

(52) U.S. Cl.
CPC ............... *H01L 21/02013* (2013.01)

(58) Field of Classification Search
CPC ................................ H01L 21/02013
See application file for complete search history.

(56) References Cited

U.S. PATENT DOCUMENTS

| | | | |
|---|---|---|---|
| 9,481,051 B2 | 11/2016 | Hirata et al. | |
| 9,620,415 B2 | 4/2017 | Hirata et al. | |
| 9,808,884 B2 | 11/2017 | Hirata et al. | |
| 9,815,138 B2 | 11/2017 | Hirata | |
| 9,868,177 B2 | 1/2018 | Hirata | |
| 9,878,397 B2 | 1/2018 | Hirata et al. | |
| 2005/0170616 A1 | 8/2005 | Murata et al. | |
| 2016/0228984 A1 | 8/2016 | Hirata et al. | |
| 2016/0228985 A1 | 8/2016 | Hirata et al. | |
| 2016/0288250 A1 | 10/2016 | Hirata et al. | |
| 2016/0288251 A1 | 10/2016 | Hirata et al. | |
| 2016/0293397 A1 | 10/2016 | Hirata et al. | |
| 2016/0305042 A1 | 10/2016 | Hirata | |
| 2016/0307763 A1 | 10/2016 | Hirata | |

(Continued)

FOREIGN PATENT DOCUMENTS

| | | |
|---|---|---|
| JP | 2001-341122 A | 12/2001 |
| JP | 2016-146446 A | 8/2016 |

(Continued)

*Primary Examiner* — Errol V Fernandes
(74) *Attorney, Agent, or Firm* — Adam R. Stephenson, Ltd.

(57) ABSTRACT

Implementations of methods of thinning a semiconductor substrate may include: providing a semiconductor substrate having a first surface and a second surface opposing the first surface, the semiconductor substrate having a thickness between the first surface and the second surface. The method may further include inducing damage into a portion of the semiconductor substrate at a first depth into the thickness forming a first damage layer, inducing damage into a portion of the semiconductor substrate at a second depth into the thickness forming a second damage layer, and applying ultrasonic energy to the semiconductor substrate. The method may include separating the semiconductor substrate into three separate thinned portions across the thickness along the first damage layer and along the second damage layer.

18 Claims, 9 Drawing Sheets

(56) References Cited

U.S. PATENT DOCUMENTS

| | | |
|---|---|---|
| 2016/0354862 A1 | 12/2016 | Hirata |
| 2017/0015017 A1 | 1/2017 | Hirata |
| 2017/0025275 A1* | 1/2017 | Hirata .................... B23K 26/53 |
| 2017/0025276 A1* | 1/2017 | Hirata ................ H01L 21/0475 |
| 2017/0053829 A1* | 2/2017 | Hirata .................... H01L 21/78 |
| 2017/0053831 A1* | 2/2017 | Hirata .................... H01L 21/78 |
| 2017/0066078 A1 | 3/2017 | Morikazu et al. |
| 2017/0136572 A1 | 5/2017 | Hirata |
| 2017/0151627 A1 | 6/2017 | Hirata |
| 2017/0198411 A1 | 7/2017 | Hirata |
| 2017/0291255 A1 | 10/2017 | Hirata |
| 2017/0348796 A1 | 12/2017 | Nishino et al. |
| 2017/0352781 A1 | 12/2017 | Obuchi et al. |

FOREIGN PATENT DOCUMENTS

| | | |
|---|---|---|
| JP | 2016-146447 A | 8/2016 |
| JP | 2016-146448 A | 8/2016 |
| JP | 2016-151457 A | 8/2016 |
| JP | 2016-197698 A | 11/2016 |
| JP | 2016-197699 A | 11/2016 |
| JP | 2016-197700 A | 11/2016 |
| JP | 2016-198788 A | 12/2016 |
| JP | 2016-207702 A | 12/2016 |
| JP | 2016-207703 A | 12/2016 |
| JP | 2016-225535 A | 12/2016 |
| JP | 2016-225536 A | 12/2016 |
| JP | 2017-005008 A | 1/2017 |
| JP | 2017-022283 A | 1/2017 |
| JP | 2017-024014 A | 2/2017 |
| JP | 2017-024039 A | 2/2017 |
| JP | 2017-024188 A | 2/2017 |
| JP | 2017-028072 A | 2/2017 |
| JP | 2017-041481 A | 2/2017 |
| JP | 2017-041482 A | 2/2017 |
| JP | 2017-057103 A | 3/2017 |
| JP | 2017-092314 A | 5/2017 |
| JP | 2017-121742 A | 7/2017 |
| JP | 2017-123405 A | 7/2017 |
| JP | 2017-188586 A | 10/2017 |
| JP | 2017-189870 A | 10/2017 |
| JP | 2017-215303 A | 12/2017 |
| JP | 2017-216423 A | 12/2017 |
| JP | 2017-216424 A | 12/2017 |
| JP | 2017-220631 A | 12/2017 |

* cited by examiner

SEMICONDUCTOR SUBSTRATE SINGULATION SYSTEMS AND RELATED METHODS

BACKGROUND

1. Technical Field

Aspects of this document relate generally to systems and methods for manufacturing substrates. More specific implementations involve systems and methods for manufacturing wafers of silicon carbide (SiC).

2. Background

Semiconductor substrates are typically formed from a boule of material using a sawing process. Many time, the saw is a wire saw which removes a certain amount of the material of the boule during the cutting process (approximately the width of the saw blade). Semiconductor substrates are polished and sometimes lapped following the sawing process.

SUMMARY

Implementations of methods of thinning a semiconductor substrate may include: providing a semiconductor substrate having a first surface and a second surface opposing the first surface, the semiconductor substrate having a thickness between the first surface and the second surface. The method may further include inducing damage into a portion of the semiconductor substrate at a first depth into the thickness forming a first damage layer, inducing damage into a portion of the semiconductor substrate at a second depth into the thickness forming a second damage layer, and applying ultrasonic energy to the semiconductor substrate. The method may include separating the semiconductor substrate into three separate thinned portions across the thickness along the first damage layer and along the second damage layer.

Implementations of a method of thinning a semiconductor substrate may include one, all, or any of the following:

The first surface may include a plurality of semiconductor devices formed therein.

The method may further include backgrinding the three thinned separate portions on those surfaces of the three separate thinned portions that faced one of the first damage layer and the second damage layer.

The semiconductor substrate may be silicon carbide.

The method may further include inducing damage into a portion of the semiconductor substrate at a third depth into the thickness forming a third damage layer. Separating the semiconductor substrate may further include separating into separate thinned portions across the thickness along the first damage layer, along the second damage layer, and along the third damage layer.

Separating the semiconductor substrate may further include applying bias force to the first surface, the second surface, or both the first surface and the second surface while applying ultrasonic energy or after applying ultrasonic energy to the semiconductor substrate.

The first depth into the thickness may be greater than the second depth.

The second depth into the thickness may be greater than the first depth.

Implementations of a method of forming semiconductor substrates may include providing a boule including a semiconductor material having a first surface thereon and inducing damage into a portion of the boule at a first depth into the boule from the first surface forming a first damage layer. The method may include inducing damage into a portion of the boule at a second depth into the boule from the first surface forming a second damage layer, applying ultrasonic energy to the boule, and separating semiconductor substrates from the boule along the first damage layer and along the second damage layer.

Implementations of a method of forming semiconductor substrates may include one, all, or any of the following:

The method may include backgrinding the semiconductor substrates on those surfaces of the semiconductor substrates that faced the first damage layer or the second damage layer.

The boule may include silicon carbide.

The method may further include inducing damage into a portion of the boule at a third depth into the boule from the first surface forming a third damage layer. Separating semiconductor substrates may further include separating semiconductor substrates along the first damage layer, along the second damage layer, and along the third damage layer.

Separating semiconductor substrates may further include applying bias force to the first surface of the boule while applying ultrasonic energy or after applying ultrasonic energy to the boule.

The first depth into the thickness may be greater than the second depth.

The second depth into the thickness may be greater than the first depth.

Implementations of a method of thinning a semiconductor substrate for reuse may include providing a semiconductor substrate including a first surface and a second surface opposing the first surface where the semiconductor substrate has a thickness between the first surface and the second surface and the first surface may have a plurality of semiconductor devices thereon. The method may include inducing damage into a portion of the semiconductor substrate at a depth into the thickness forming a damage layer, applying ultrasonic energy to the semiconductor substrate, and separating the semiconductor substrate into two thinned portions across the thickness along the first damage layer where a first one of the two thinned portions includes the plurality of semiconductor devices. The method may also include forming one or more semiconductor devices on a second one of the two thinned portions.

Implementations of a method of thinning a semiconductor substrate for reuse may include one, all, or any of the following:

The method may include backgrinding the two thinned portions on those surface of the two thinned portions that faced the first damage layer.

The semiconductor substrate may be silicon carbide.

Separating the semiconductor substrate may further include applying bias force to the first surface, the second surface, or both the first surface and the second surface while applying ultrasonic energy to the semiconductor substrate or after applying ultrasonic energy to the semiconductor substrate.

The method may further include inducing damage into a portion of the second one of the two thinned semiconductor substrates at a depth into a thickness of the thinned semiconductor substrate forming a damage layer. The method may also include applying ultrasonic energy to the second one of the two thinned semiconductor substrates and separating the second one of the two thinned semiconductor substrates into two thinned portions across the thickness along the damage layer. A first one of the two thinned portions may include the plurality of semiconductor devices formed on the second one of the two thinned semiconductor substrates. The method may include forming one or more semiconductor devices on a second one of the two thinned portions.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor substrate manufacturing systems and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor substrate manufacturing system and related methods, and implementing components and methods, consistent with the intended operation and methods.

A wide variety of semiconductor substrate types exist and are used in the process of manufacturing various semiconductor devices. Non-limiting examples of semiconductor substrates that may be processed using the principles disclosed in this document include single crystal silicon, silicon dioxide, $Al_xGa(1-x)N$, $(0<x<1)$, glass, silicon-on-insulator, gallium arsenide, sapphire, ruby, silicon carbide, polycrystalline or amorphous forms of any of the foregoing, and any other substrate type useful for constructing semiconductor devices. Particular implementations disclosed herein may utilize silicon carbide semiconductor substrates (silicon carbide substrates) of any polytype. In this document the term "wafer" is also used along with "substrate" as a wafer is a common type of substrate, but not as an exclusive term that is used to refer to all semiconductor substrate types. The various semiconductor substrate types disclosed in this document may be, by non-limiting example, round, rounded, square, rectangular, or any other closed shape in various implementations.

Figure 1:
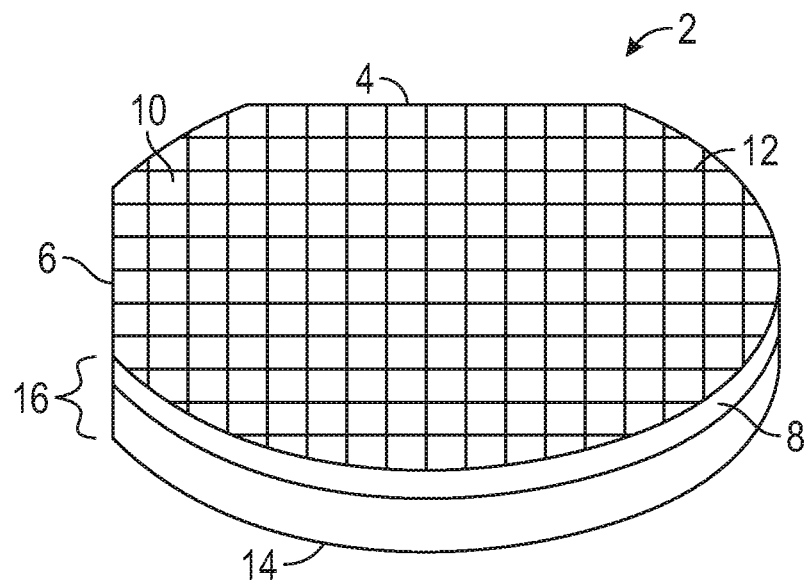
FIG. 1 is a perspective view of a silicon carbide semiconductor substrate.

Referring to FIG. 1, a perspective view of a semiconductor substrate 2 is illustrated. This substrate is a wafer of silicon carbide as evidenced by the orientation of the two flats 4, 6 on the wafer. This wafer has had a plurality of semiconductor devices 12 formed thereon in a layer 8 on a first side 10 of the wafer. A second side 14 of the wafer is illustrated that opposes the first side 10 and a thickness 16 of the wafer extends between them. As illustrated, the substrate 2 thickness 16 is the one that was created when it was separated from the boule it was originally cut or otherwise separated from. Either before processing of the substrate 2 to form semiconductor devices thereon or after processing, the substrate 2 is desired to be thinned. Thinned substrates may provide various desirable characteristics for performance of the semiconductor devices, such as, by non-limiting example, lower on resistance, better heat performance, small package form factor/thickness, etc. Thinning of the substrate may also be driven by factors that include the inability to get the substrate to separate from the boule to produce a substrate below a certain thickness due to substrate formation process limitations or wafer processing equipment limitations that prevent processing of wafers below a certain thickness. Many reasons may exist that drive the need/interest in thinning the semiconductor substrate.

Figure 2:
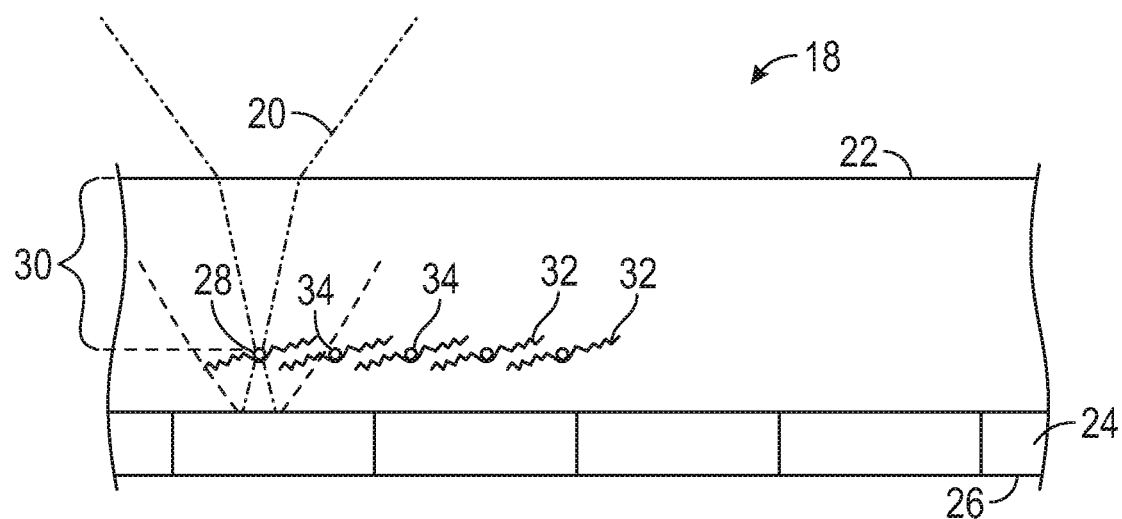
FIG. 2 is a cross sectional view of a semiconductor substrate with a damage layer being formed therein.

Referring to FIG. 2, a cross sectional view of a substrate 18 is illustrated. As illustrated, a laser beam 20 is irradiating the second surface 22 of the substrate 18, the side opposing the semiconductor devices 24 formed on the first surface 26 of the substrate. A focal point 28 of the laser beam 20 is set a depth 30 into the semiconductor substrate so that it is located within the semiconductor substrate below the second surface 22. The wavelength of the laser light used to irradiate the second surface 26 is one for which the material of the particular semiconductor substrate is at least partially optically transmissive, whether translucent or transparent. The focal point 28 creates an area of damage in the substrate 2 at and around the focal point 28. The degree of damage is determined by many factors, including, by non-limiting example, the power of the laser light, the duration of exposure of the material, the absorption of the material of the substrate, the crystallographic orientation of the substrate material relative to the direction of the laser light, the atomic structure of the substrate, and any other factor regulating the absorbance of the light energy and/or transmission of the induced damage or heat into the substrate.

The substrate 18 illustrated in FIG. 2 is a silicon carbide (SiC) substrate, and so the laser light wavelength that may be employed may be any capable of transmitting into the SiC substrate material. In particular implementations, the wavelength may be 1064 nm. In various implementations, the laser light source may be a Nd:YAG pulsed laser or a YVO4 pulsed laser. In one implementation where a Nd:YAG laser is used, a spot size of 10 microns and an average power of 3.2 W may be used along with a repetition frequency of 80 kHz, pulse width of 4 ns, numerical aperture (NA) of the focusing lens of 0.45. In another implementation, a Nd:YAG laser may be used with a repetition frequency of 400 kHz, average power of 16 W, pulse width of 4 ns, spot diameter of 10 microns, and NA of 0.45. In various implementations, the power of the laser may be varied from about 2 W to about 4.5 W. In other implementations, however, the laser power may be less than 2 W or greater than 4.5 W.

As illustrated, the focal point 28 of the laser light forms a location of rapid heating and may result in full or partial melting of the material at the focal point 28. The point of rapid heating and the resulting stress on the hexagonal single crystal structure of the SiC substrate results in cracking of the substrate material along a c-plane of the substrate. Depending on the type of single SiC crystal used to manufacture the boule, the c-plane may be oriented at an off angle to the second surface of about 1 degree to about 6 degrees. In various implementations, this angle is determined at the time the boule is manufactured. In particular implementations, the off angle may be about 4 degrees.

During operation, the laser is operated in pulsed operation to create numerous overlapping spots of pulsed light while passing across the surface of the substrate. As a result, a continuous/semi-continuous layer/band of modified material is formed within the wafer. In other implementations, the laser may be operated in continuous wave mode rather than pulsed mode to create the band of modified material. As illustrated, the stress caused by the focal point 28 causes cracking along the c-plane in the material of the SiC substrate 18 in one or both directions along the c-plane or in both directions. These cracks 32 are illustrated as spreading from the focal point 28 area (where the modified layer/band is located) angled at the off angle in FIG. 1. In various implementations, the cracks 32 may be located below the focal point 28, above the focal point 28, or spread directly from the focal point 28, depending on the characteristics of the laser and the method of application of the laser to the material. In various implementations, the length of the cracks into the substrate is a function of the power of the laser applied. By non-limiting example, the depth of the focal point was set at 500 um into the substrate; where the laser power was 3.2 W, the crack propagation from the modified layer/band was about 250 um; where the laser power was at 2 W, the crack lengths were about 100 um; where the laser power was set at 4.5 W, the crack lengths were about 350 um.

As illustrated, the substrate 18 can be indexed below the laser beam 20 (or the laser beam 20 can be indexed above the substrate 18, or both can be indexed together) to produce a plurality of spaced apart locations 34 where damage has been induced in the substrate. The width between the plurality of spaced apart locations 34 can be a function of the crack lengths into the material of the wafer, and/or the amount of damage layer formed as a wafer is initially scanned. By non-limiting example, the width may be set between about the length of the cracks into the wafer to about twice the length of the cracks into the wafer. In situations where the damage layer is being initially formed during scanning over the wafer on one side of the wafer, the width between the spaced apart locations can be initially reduced. By non-limiting example, initially the width may be set to 200 um until the cracks begin to spread from the modified layer, at which point the width (index amount) may be set to 400 um. The feed speed of the wafer under the laser (or the laser above the wafer) may be, by non-limiting example, 400 mm/second, though slower or faster feed speeds may be used in various implementations.

While a plurality of spaced apart locations 34 are illustrated, in various implementations, the laser beam 20 may not be applied in an indexed manner, but may be applied in a continuous or substantially continuous manner to the material of the substrate to create continuous or substantially continuous zones/areas of damage in the substrate. These areas of damage may include corresponding continuous cracking or discontinuous cracking of the substrate material. The plurality of spaced apart locations 34 or the continuous lines/areas affected by the laser irradiation form a damage layer within the semiconductor substrate after the laser has completed indexing/passing over the semiconductor substrate material.

The objective of forming the damage layer is to break up the structure of the semiconductor substrate material (in the case of SiC, the hexagonal crystalline structure of the substrate). The resulting broken up structure then can be used to separate the substrate into two portions on each side of the damage layer. A wide variety of methods and systems can be used to perform the separation after formation of the damage layer within the substrate, including, by non-limiting example, physical separation using rotation, ultrasonic energy separation, vacuum force, and any combination thereof. Various systems and methods for separating semiconductor substrates and thinning them thereby are disclosed in this document.

Figure 3:
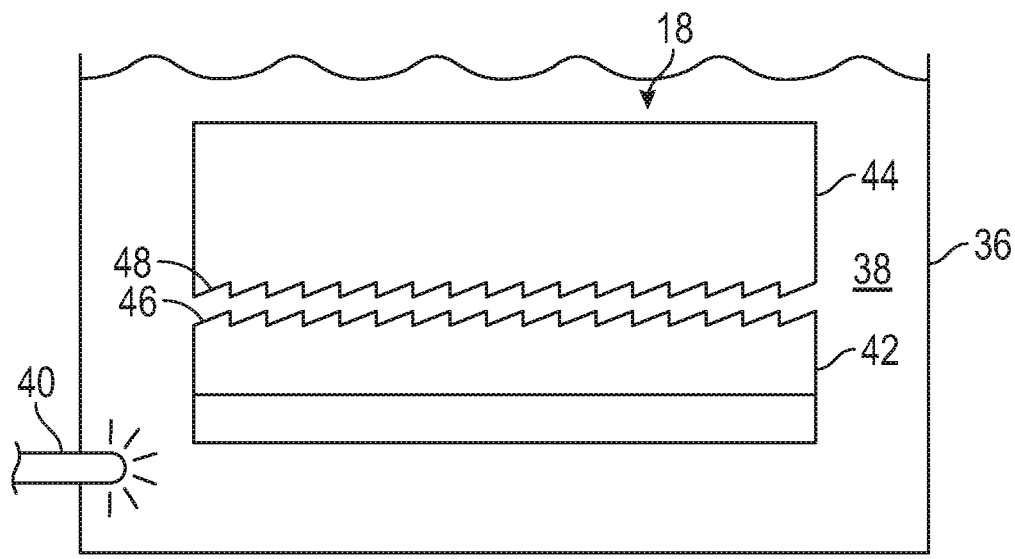
FIG. 3 is a cross sectional view of the semiconductor substrate of FIG. 2 being separated in to three thinned portions by application of ultrasonic energy to a liquid bath.

Referring to FIG. 3, the substrate of FIG. 2 is illustrated following formation of the damage layer across the entire substrate 18 following indexing of the laser beam 20 across the entire substrate 18. The substrate 18 has been placed in a bath 36 of liquid 38 into which a source of ultrasonic energy 40 is being contacted. A wide variety of frequencies may be employed by the source of ultrasonic energy 40 which may range from about 20 kHz to about 3 GHz. Where the sonic frequencies utilized by the ultrasonic energy source 40 are above 360 kHz, the energy source may also be referred to as a megasonic energy source. In particular implementations, the ultrasonic energy source 40 may generate ultrasonic vibrations at a frequency of 40 kHz at a power of 80 W. In various implementations, the ultrasonic energy source 40 may apply a frequency of between about 30 kHz to about 50 kHz or about 35 kHz to about 45 kHz. However, in various implementations, frequencies higher than 50 kHz may be employed, including megasonic frequencies. A wide variety of power levels may also be employed in various implementations.

A wide variety of liquids could be employed in the bath 36, such as, by non-limiting example, aqueous liquids, organic liquids, water, solvents, and any other liquid that exists as a liquid under the conditions within the bath. In various implementations, the form of the ultrasonic energy source 40 may include a probe that extends into the wafer and which is vibrationally isolated from the vessel into which the probe extends so that the ultrasonic energy generated by the probe substantially transmits into the water medium and not into the material of the vessel itself. Multiple ultrasonic energy sources may be coupled to the liquid medium in various implementations. The ultrasonic energy source 40 may employ a wide variety of transducer designs in various implementations, including, by non-limiting example, magnetostrictive transducers and piezoelectric transducers. In the case where a magnetostrictive transducer is utilized, the transducer utilizes a coiled wire to form an alternating magnetic field inducing mechanical vibrations at a desired frequency in a material that exhibits magnetostrictive properties, such as, by non-limiting example, nickel, cobalt, terbium, dysprosium, iron, silicon, bismuth, aluminum, oxygen, any alloy thereof, and any combination thereof. The mechanical vibrations are then transferred to the portion of the ultrasonic energy source that contacts the liquid. Where a piezoelectric transducer is employed, a piezoelectric material is subjected to application of electric charge and the resulting vibrations are transferred to the portion of the ultrasonic energy source that contacts the liquid. Example of piezoelectric materials that may be employed in various implementations include, by non-limiting example, quartz, sucrose, topaz, tourmaline, lead titanate, barium titanate, lead zirconate titanate, and any other crystal or material that exhibits piezoelectric properties.

The ultrasonic (or megasonic) energy from the ultrasonic energy source 40 transfers into the substrate 18. Because of the cracks that exist in the damage layer, the vibration of the substrate causes the cracks to propagate and join the other cracks in the damage layer, eventually causing the substrate 18 to separation into a first thinned portion 42 and a second thinned portion 44. Because of the angle of the cracks, each of the thinned portions 42, 44 exhibits striations 46, 48 which are represented for purposes illustration in FIG. 3 as corresponding sawtooth patterns. In reality, the striations exhibit a random pattern based on the particular locations where the crystal planes separate between the two substrates. The striations exist in silicon carbide substrates due to the off angle, but in other substrates which have no off angle, no striations may be formed. After the thinned portions 42, 44 separate, they may be retrieved from the bath 36 and used in other method implementation and further processing as described in this document.

Figure 4:
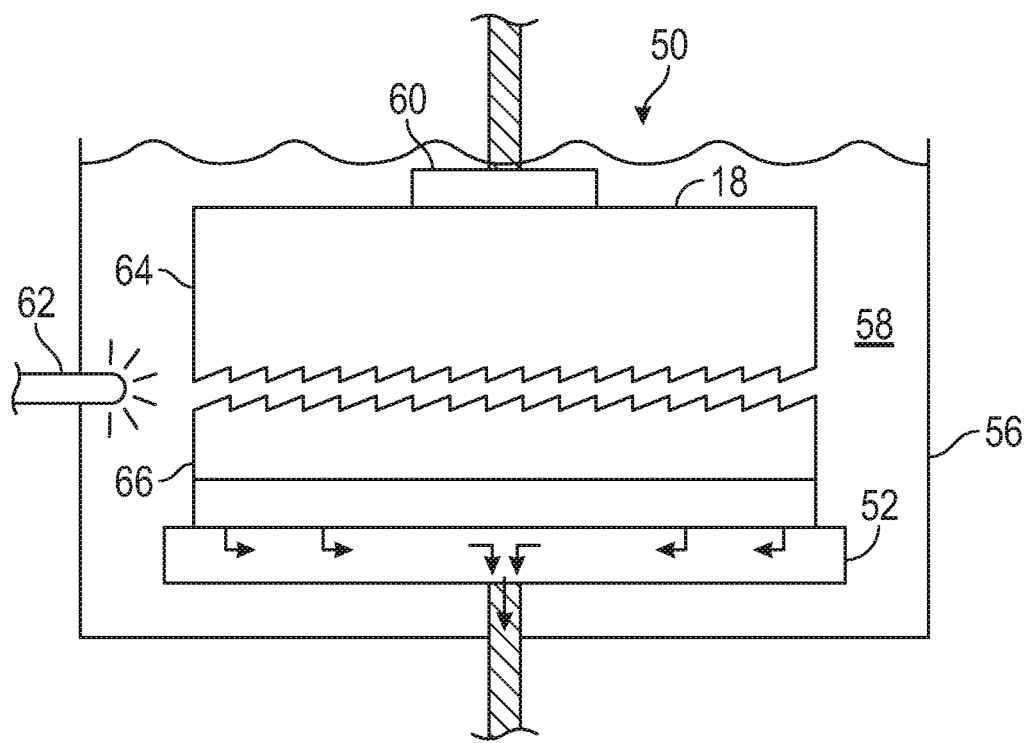
FIG. 4 is a cross sectional view of the semiconductor substrate of FIG. 2 being separated into three thinned portions during application of ultrasonic energy and vacuum force to the second surface of the substrate.

Referring to FIG. 4, an implementation of the substrate 18 of FIG. 2 in another implementation of a wafer thinning system 50 is illustrated. As illustrated, a substrate support chuck 52 is used to contact the first surface of the substrate 18. In various implementations, the substrate support chuck 52 is a porous vacuum chuck. As a porous vacuum chuck, a vacuum source is applied to the back of the chuck and air is drawn into material of the chuck through the various pores in the chuck, drawing the wafer against the chuck. As illustrated, the chuck may be slightly larger than the size of the substrate and those portions that are exposed to the liquid may not be porous, preventing the liquid from being drawn into the chuck. In various system implementations, a wafer separation chuck 60 connected to a vacuum source is coupled to the second side of the substrate 18 and held against the second side with vacuum force. Like the implementation of FIG. 3, an ultrasonic energy source 62 is in contact with the liquid 58 in the bath, and transmits ultrasonic energy to the liquid and the substrate 18. The ultrasonic energy source 62 may be any disclosed in this document and may employ any frequency disclosed in this document.

As illustrated, the ultrasonic energy from the ultrasonic energy source 62 is transferred from the liquid 58 to the substrate 18 and causes the substrate to separate along the damage layer into a first thinned section 64 and second thinned section 66. The drawing illustrates the striations formed through the separation of the crystal planes via the off axis cracks developed in the damage layer. As illustrated, the wafer separation chuck 60 and the substrate support chuck 54 maintain control of the first thinned section 64 and the second thinned section 66 following separation, preventing their migration or movement in the liquid 58 following separation. In particular implementations, in addition to separating the thinned sections (portions) using ultrasonic energy, force may be applied to separate the substrates through the vacuum forces drawing each surface of the substrate to the substrate support chuck 54 and the wafer separation chuck 60. Furthermore, in various implementations, the substrate chuck may be subjected to a biasing force away from the substrate support chuck 54 during the application of the ultrasonic energy to the substrate. Due to the vacuum force holding the substrate 18 to the wafer separation chuck 60, the bias force applied to the chuck 60 transfers to the substrate 18 and may assist with separating the substrate more quickly. The bias force can be applied using, by non-limiting example, a spring, a motor, a hydraulic cylinder, or any other method of providing biasing force against a surface or rod attached to the chuck 60. The wafer separation chuck 60 can also be used to draw the first thinned portion out of the liquid 58 of the bath 56 following separation. A wide variety of system implementations may be devised to support and/facilitate the separation of the substrates during application of ultrasonic energy to them based on the principles disclosed in this document.

Figure 5:
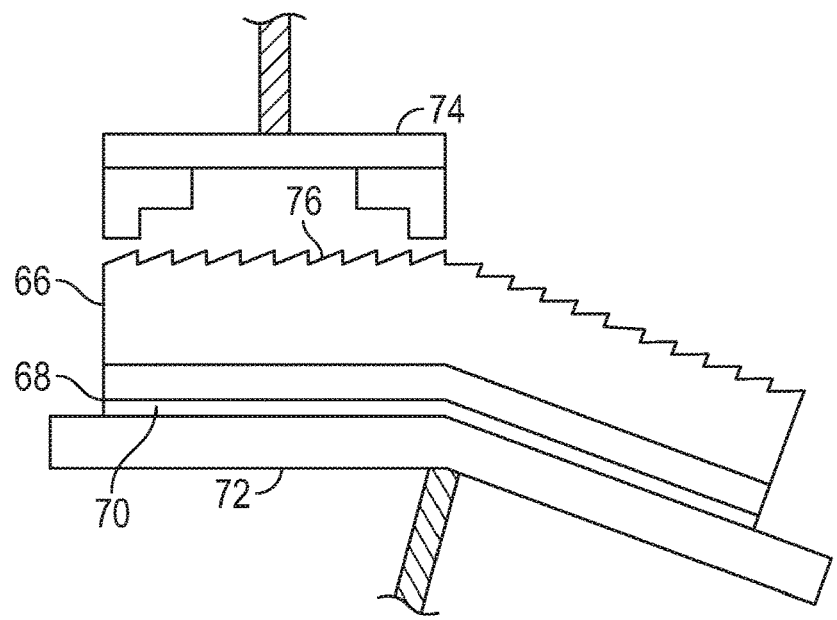
FIG. 5 is a cross sectional view of a first portion of the semiconductor substrate of FIG. 2 being background.
Figure 6:
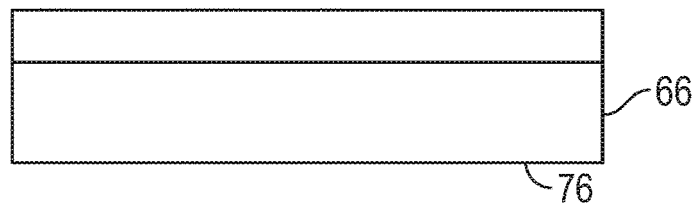
FIG. 6 is a cross sectional view of the first portion of the semiconductor substrate after backgrinding.

Referring to FIG. 5, following separation of the substrate of FIG. 2 into two thinned portions, the second thinned portion 66 is illustrated being background, the first surface 68 of the portion 66 being covered with backgrinding tape 70 to protect the semiconductor devices formed in the first surface 68 during the grinding process. The backgrinding tape 70 is coupled using vacuum force to a backgrinding chuck 72 and a grinding wheel 74 rotates against the second surface 76 of the second thinned portion 66 which faced the damage layer formed in the original substrate. The purpose of the backgrinding of the second thinned portion may be to just remove the striations on the second surface 76 or may be to further thin the second thinned portion to a desired thickness. In various implementations, backgrinding tape 70 may not be used. Also, the backgrinding chuck 72 may or may not rotate along with the grinding wheel 74. FIG. 6 illustrates the second thinned portion 66 following thinning, showing the second side 76 rendered substantially smooth and ready for further processing, such as, by non-limiting example, singulation via sawing, wafer scale packaging, further fab processing, and any other desired operation.

The process of forming a damage layer can also be applied to separating a substrate from a boule of semiconductor material. The changes to the systems and method already illustrated would be that the boule would be placed in the bath of liquid and that a substrate support chuck would not be used, but rather a structure to support the boule in the bath while a substrate separation chuck could still be used (or not) during the application of ultrasonic energy. In this way, following creation of the damage layer by laser irradiating the first surface of the boule, a substrate can be separated from the boule and prepared for additional processing (such as polishing, grinding, etc.) to remove any striations (in the case of silicon carbide boules and substrates). The use of a single damage layer permits formation of a single substrate from the boule at a time.

Figure 7:
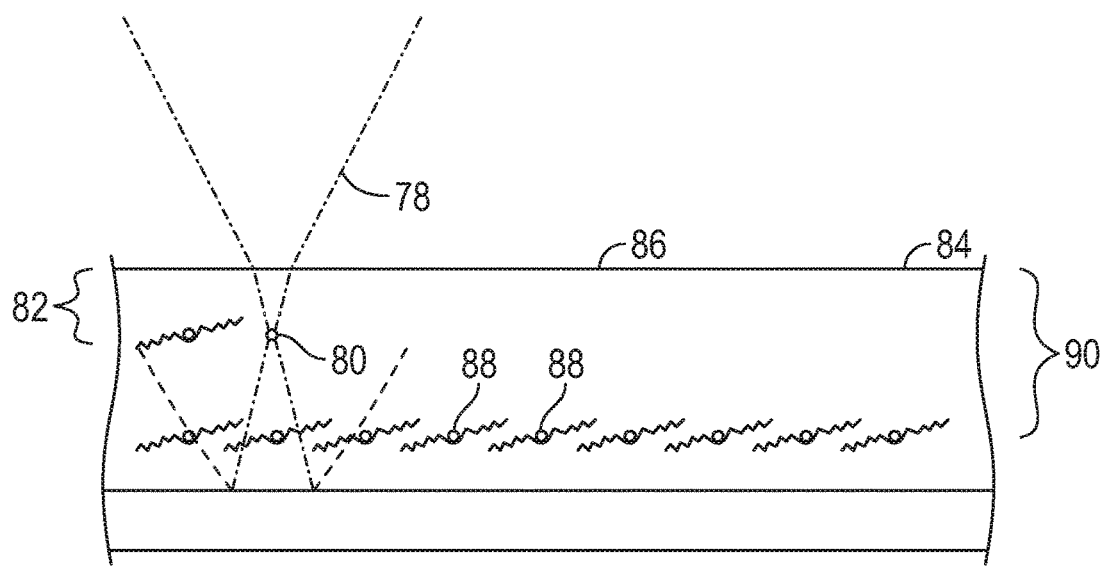
FIG. 7 is a cross sectional view of a semiconductor substrate during formation of a second damage layer therein.
Figure 8:
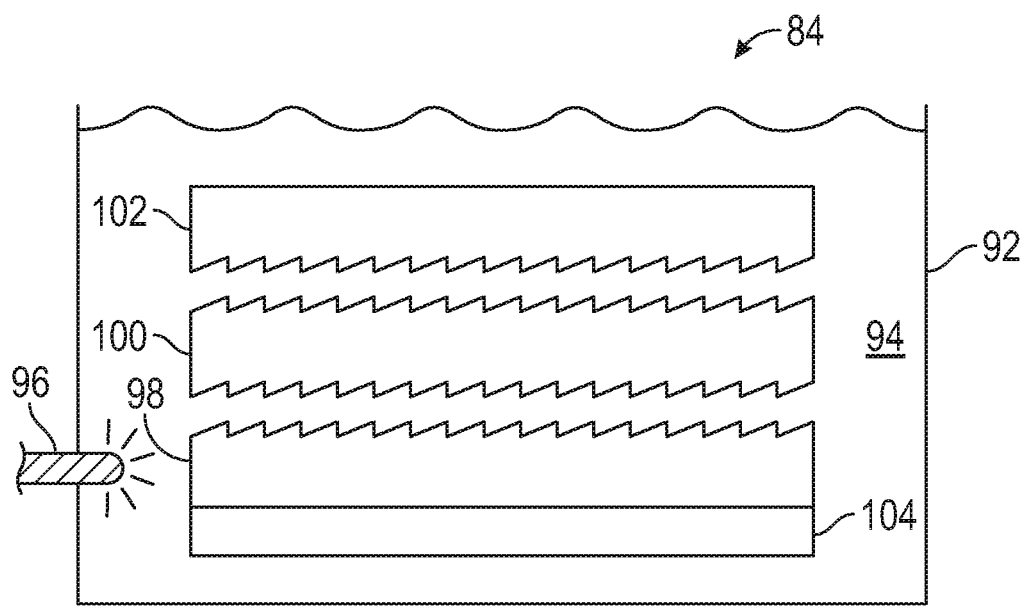
FIG. 8 is a cross sectional view of the semiconductor substrate of FIG. 7 being separated into three thinned portions by application of ultrasonic energy to a liquid bath.

The system and method implementations illustrated in FIG. 2 and discussed thus far herein have utilized forming a single damage layer to separate the substrate into two thinned portions or separating a single substrate from a boule. Referring to FIGS. 7-9 and 16-18 system and method implementations that utilize forming multiple damage layers to separate a substrate into multiple portions or separate multiple substrates from a boule are illustrated. FIG. 7 illustrates a laser beam 78 forming a focal point 80 at a second depth 82 into a substrate 84 from a second side 86 of the substrate 84. As illustrated, a first damage layer formed by a plurality of spaced apart locations 88 with the accompanying cracking into the substrate from the locations 88 has already been formed through irradiating with the laser at a first depth 90 from the second side 86 of the substrate. In this implementation, a plurality of spaced apart locations at the second depth following irradiation will form a second damage layer within the substrate 84. In this implementation, the laser irradiation was done at the first depth 90 first and then at the second depth 82 second, the first depth 90 being larger than the second depth into the thickness of the substrate. This may ensure that damage to the crystal structure caused by the formation of the first damage layer does not impede the laser's ability to form focal points to form the second damage layer. In other implementations, however, the first depth may be smaller than the second depth and the laser irradiation at the smaller depth may be conducted first before laser irradiation deeper into the wafer to form the second damage layer. In such implementations, the spaced apart locations used for the second damage layer may not be directly aligned with the spaced apart locations used for the first damage layer, to minimize the effect of the first damage layer on the laser light used to form the second damage layer.

Following the laser irradiation to form the first and second damage layers, the substrate 84 is placed in a bath 92 filled with liquid 94 which may be any liquid disclosed in this document. Ultrasonic energy is then transmitted to the substrate 84 from an ultrasonic energy source 96 placed in contact with the liquid 94 like any ultrasonic energy source disclosed in this document. Under the influence of the ultrasonic energy, the cracks formed in the first and second damage layers propagate and separate in the liquid permitting the substrate 84 to separate into three thinned portions 98, 100, 102, the first thinned portion 98 having the semiconductor devices 104 formed thereon. Following separation, the three thinned portions 98, 100, 102 can then be used for further processing as described herein. Since the substrates are silicon carbide substrates in FIG. 8, the presence of the striations along the surface of the substrates that face the first and second damage layers is illustrated using the sawtooth representations.

Figure 9:
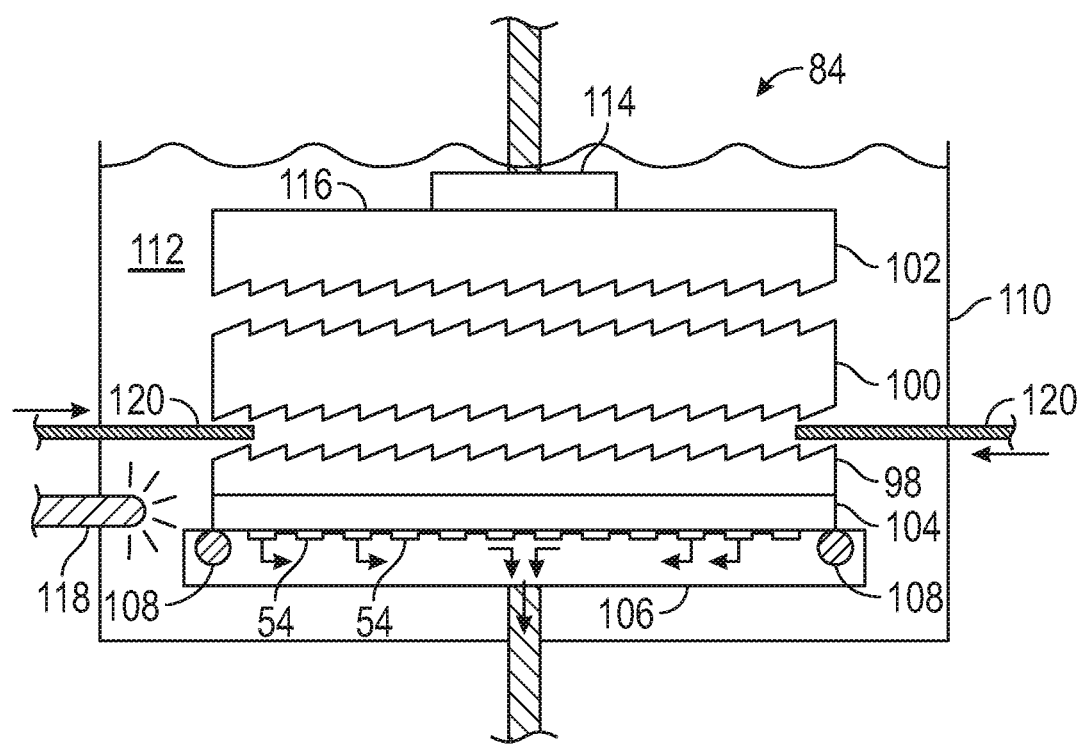
FIG. 9 is a cross sectional view of the semiconductor substrate of FIG. 7 being separated into three thinned portions during application of ultrasonic energy and vacuum force to the second surface of the substrate.

Referring to FIG. 9, the substrate 84 is shown placed in a system similar to that illustrated in FIG. 4, where a substrate support chuck 106 with a plurality of vacuum holes and indentations 54 therein which allow air to flow into the indentations and be routed within channels within the chuck 106. In this case, the chuck is not a porous chuck, but one with specifically created macroscopic vacuum channels therein. The vacuum source is sealed against liquid intrusion into the indentations 54 using o-ring 108 is used to hold the first surface of the substrate to the chuck 106 while the liquid is present around the chuck. The chuck 106 is placed in a bath 110 filled with a liquid 112 which may be any liquid disclosed in this document. As illustrated, a wafer separation chuck 114 is coupled with the second surface 116 of the substrate 84 using vacuum force. The wafer separation chuck 114 may be biased in particular implementations against the face of the second surface 116 in similar ways to that disclosed with the implementation illustrated in FIG. 4. Ultrasonic energy is then applied to the liquid 112 and the substrate 84 from ultrasonic energy source 118 which may be any such source disclosed in this document. As illustrated, the substrate 84 separates under the influence of the ultrasonic energy along the first damage layer and second damage layer into the three thinned portions 98, 100, 102 like in the implementation illustrated in FIG. 8. In various implementations, additional support features such as pins 120 may be inserted in between the various thinned portions to hold and/or support them following separation of the thinned portions. The wafer separation chuck 114 may be used to remove the thinned portions from the bath in various implementations as well. A wide variety of different system configurations may be constructed to handle the various multiple thinned portions following separation using ultrasonic energy using the principles disclosed herein.

Figure 16:
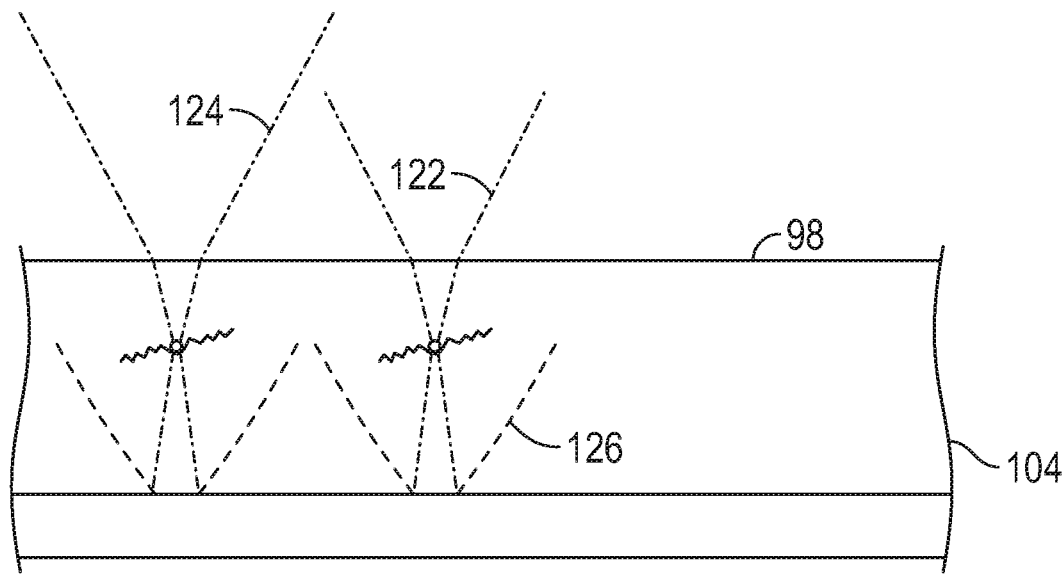
FIG. 16 is a cross sectional view of a semiconductor substrate where a damage layer is being formed using two laser beams simultaneously.

Referring to FIG. 16, an implementation of the first thinned portion 98 from FIG. 9 is illustrated showing the formation of a damage layer therein at a desired depth from a second surface of the thinned portion using laser beams 122, 124. FIG. 16 illustrates that, in any laser irradiation process disclosed in this document, multiple laser beams may be employed, including those that index across the substrate as specified distances apart together, or indexing separately. Also, in some implementations, the laser beams may be applied from different sides of the substrate at the same time, indexing together or separately. FIG. 16 also illustrates that the thinned portions can be processed again to form a damage layer therein (whether after the backgrinding step or before backgrinding) and separated using ultrasonic energy using any of the system disclosed in this document creating first and second thinned portions of the original first thinned portion 98. These additional thinned portions can then continue processing using any of the processes disclosed in this document. FIG. 16 also illustrates that, when processing over the semiconductor devices 104, a certain amount of the laser light 126 may be reflected back into the material of the thinned portion 98.

Figure 17:
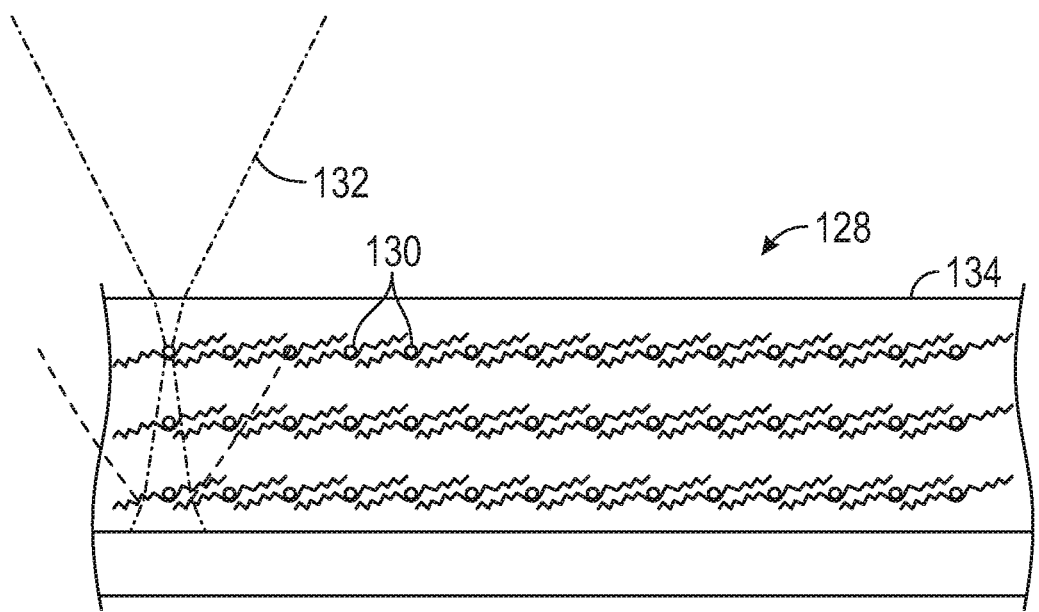
FIG. 17 is a cross sectional view of a semiconductor substrate showing the formation of a third damage layer within the substrate.
Figure 18:
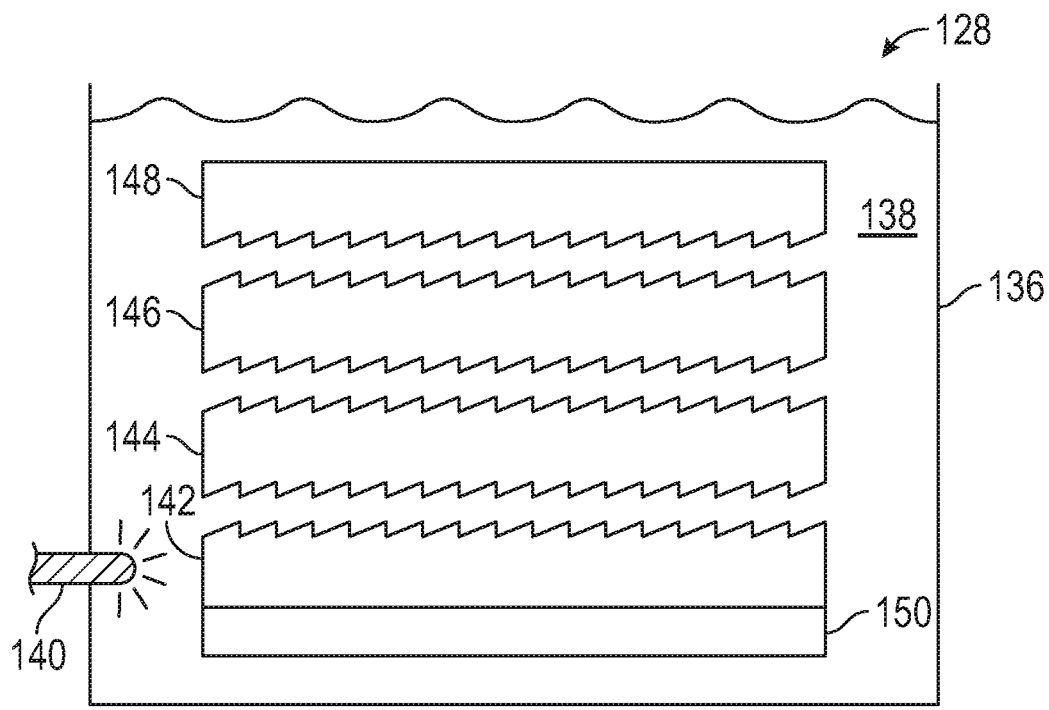
FIG. 18 is a cross sectional view of the semiconductor substrate of FIG. 17 being separated into four thinned portions by application of ultrasonic energy to a liquid bath.

FIG. 17 illustrates a substrate 128 during completion of the formation of a third damage layer through the formation of a third plurality of spaced apart locations 130 and laser beam 132. The third damage layer is formed through irradiating at a third depth into the substrate from the second side 134 of the substrate 128. The third damage layer may be formed after forming the first damage layer and the second damage layer in some implementations. In other implementations, the third damage layer may be formed after the first or the second damage layers, depending on how the indexing of the various laser processing is conducted. As previously discussed, the positioning of the plurality of spaced apart locations in each layer may be coordinated to minimize laser beam attenuation through the substrate in various implementations, particularly in implementations where the laser beam is irradiated through a damage layer. FIG. 18 illustrates the substrate 128 after being placed in a bath 136 like that illustrated in FIG. 8 filled with liquid 138 which may be any disclosed in this document. Following the application of ultrasonic energy from ultrasonic energy source 140 (which may be any disclosed in this document) the substrate 128 separates along the first, second, and third damage layers within the substrate into first, second, third, and fourth thinned portions 142, 144, 146, and 148, respectively. The substrate 128 is a silicon carbide substrate, so the various striations are illustrated using sawtooth patterns on the thinned portions 142, 144, 146, 148. In various implementations, various systems may be employed to support/aid in separating the various thinned portions which may include any in this document.

As illustrated in FIG. 18, three different thinned portions 144, 146, 148 are separated from the substrate that do not include the semiconductor devices 150 thereon, which is on the first thinned portion 142. Where the thinned portions 144, 146, and 148 are made of silicon carbide, the properties of silicon carbide are such that SiC substrates that are as thin as 100 um exhibit sufficient structural stability to processed equivalently to full thickness silicon wafers. Because of these, depending on the final thicknesses of any one or all of the three different thinner portions 144, 146, 148, any one or all of them could be subsequently polished and then used as a substrate for the formation of additional semiconductor devices. Because the strength of silicon carbide is greater than that of silicon alone, in various method implementations, the thinned portions can be reprocessed through the semiconductor device fabrication process to form either the same or different semiconductor devices as were formed using the original substrate.

As part of this process, the surfaces of the thinned portions that face the damage layers would need to be background/polished to remove the striations prior to processing, and the fabrication tools would need to be adjusted so that they could identify the existence of the thinned wafers. This generally may require calibrations of wafer cassette scanning devices and other robotic wafer handling systems so that the presence and absence of the wafer in a cassette or other wafer transfer device can be reliably identified. Such calibrations are done for full thickness wafers already, so the adjustments can be stored allowing the tools to process both full thickness and thinned substrates using different calibration schemes and/or recipes.

Figure 19:
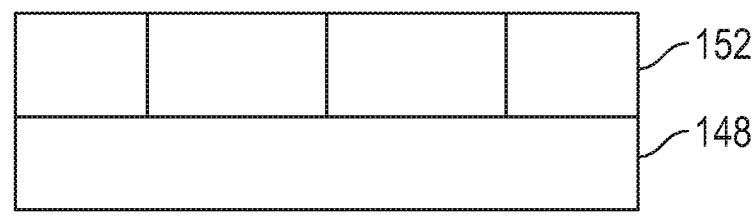
FIG. 19 is a cross sectional view of a thinned portion of a semiconductor substrate following processing to form at least one semiconductor device thereon.

FIG. 19 illustrates the thinned substrate 148 following processing to form semiconductor devices 152 thereon using a fabrication process following separation. Since the thinned substrate 148 is already thinned to a specified point, the use of thinned substrates may permit manufacturing of particular devices while avoiding the loss of substrate material due to backgrinding or sawing, thus increasing the profitability of the overall manufacturing process involving SiC. Since backgrinding and sawing operations are very expensive due to the high hardness of SiC, the ability to reuse thinned portions and create multiple thinned portions from a substrate may be very advantageous.

While the processes for the formation of multiple thinned substrates from a single substrate have thus far been disclosed in the context of separating an already existing substrate, the same principles can be applied to separating multiple substrates from a boule. For example, two or more damage layers may be formed in the boule at two different depths from a first surface of the boule using any of the laser irradiation processes disclosed in this document. The boule can then placed in a bath surrounded by liquid while ultrasonic (or megasonic as previously disclosed) energy is applied to the liquid and transferred to the boule. The two or more silicon substrates then separate from the boule along the first damage layer and along the second damage layer (and any other damage layer in the boule). The silicon substrates can then be background/polished on those surfaces that faces the first damage layer or the second damage layer. In various implementations, the boule may be supported in a variety of ways within the bath, as previously described in this document for the process of singulating a single substrate from the boule. Also, any of the system functions involving wafer separating chucks or support pins may be employed in various substrate formation method implementations.

In various implementations of boule processing, the use of a dispersion prevention layer over the first surface of the boule may eliminate the need to polish the first surface of the boule after the separation of the multiple (or single) substrates therefrom. This dispersion prevention layer includes a material designed to reduce or substantially eliminate dispersion effects of the laser light as it enters the material of the first surface of the boule through the striations formed through the substrate separation process at the damage layers. This dispersion prevention material may, in various implementations, be designed to have an index of refraction for the particular wavelength of laser light substantially similar to the index of refraction of SiC (or any other semiconductor substrate material being processed). In other implementations, the thickness of the dispersion prevention layer above the second surface is determined based on the particular wavelength of laser light being used to reduce and or eliminate the diffraction of the laser light. In a particular implementation, the where the laser light wavelength is represented by $\lambda$, a formula for the thickness (t) may be $t=(\lambda/4)*(2n+1)$ where n ranges between 0 and a positive integer.

In various implementations, the material of the dispersion prevention layer may be, by non-limiting example, polyvinyl alcohol, nonaqueous soluble polymers, water soluble polymers, water soluble polyester, water soluble phenol, bisphenol fluorine, poly (penta bromo phenyl methacrylate), poly (penta bromobenzyl methacrylate), iodonapthalene, bromonapthalene, gels, films, optically transmissive polyimides, oils, and any other optically transmissive water or organic based material capable of being applied over the wafer. In various implementations of dispersion prevention layers, nanoparticles including, by non-limiting example, $TiO_2$ with a refractive index of 2.1, $ZrO_2$ with a refractive index of 2.3, or any other material with a refractive index similar to the substrate may be used.

The ability to separate multiple substrates at a time using damage layers formed through laser irradiation, particularly for silicon carbide boules, may result in significant processing cost savings per substrate produced. Furthermore, where techniques permit the use of dispersion layers, the costs and time associated with polishing the first surface of the boule prior to re-irradiation to form a second set of substrates therein may be eliminated as well.

Figure 10:
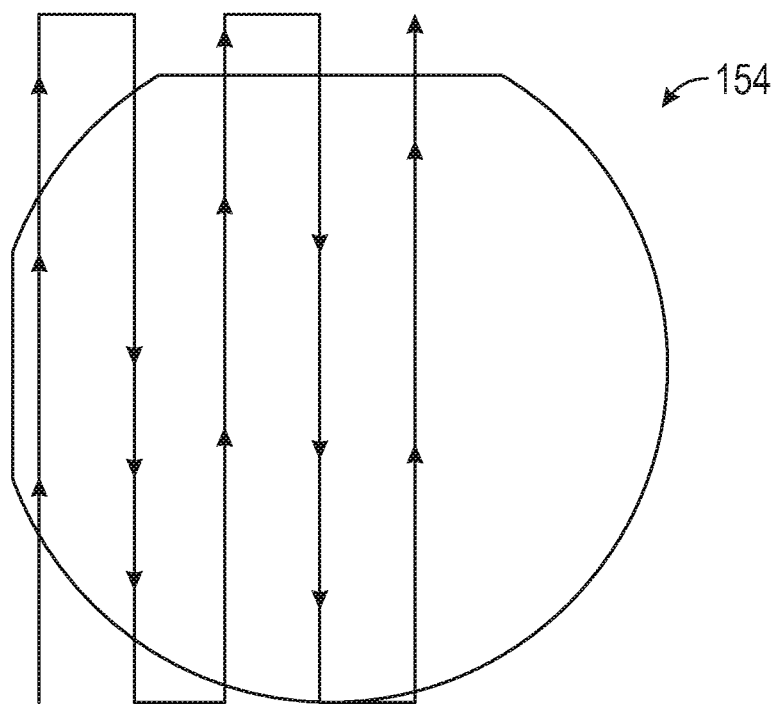
FIG. 10 is a diagram of a semiconductor substrate with an alternating single pass laser irradiation path (single pass path) illustrated thereon.

In all the method and system implementations used to thin semiconductor substrates and form semiconductor substrates from boules, a wide variety of indexing patterns and techniques may be employed. Referring to FIG. 10, a diagram 154 of a semiconductor substrate (or boule) with an alternating single pass laser irradiation path (single pass path) is illustrated. In this implementation, the pulsed or continuous wave laser radiation creates a set of parallel or substantially parallel layers of modified material beneath the beam which result in cracking spreading in both directions toward each of the parallel layers. As previously discussed, the spacing of the alternating passes may vary depending on the power of the laser, the material, and many other factors disclosed herein. In a multi-damage layer formation thinning or substrate formation process, a single pass process may be used, where each pass is substantially the same as each other pass. In other implementations, however, the positioning of each pass may be adjusted to optimize the effect of the cracking spread for each layer or in response to the optical challenges associated with developing a focal point deeper into the substrate or boule when compared to less deep focal point passes.

Figure 11:
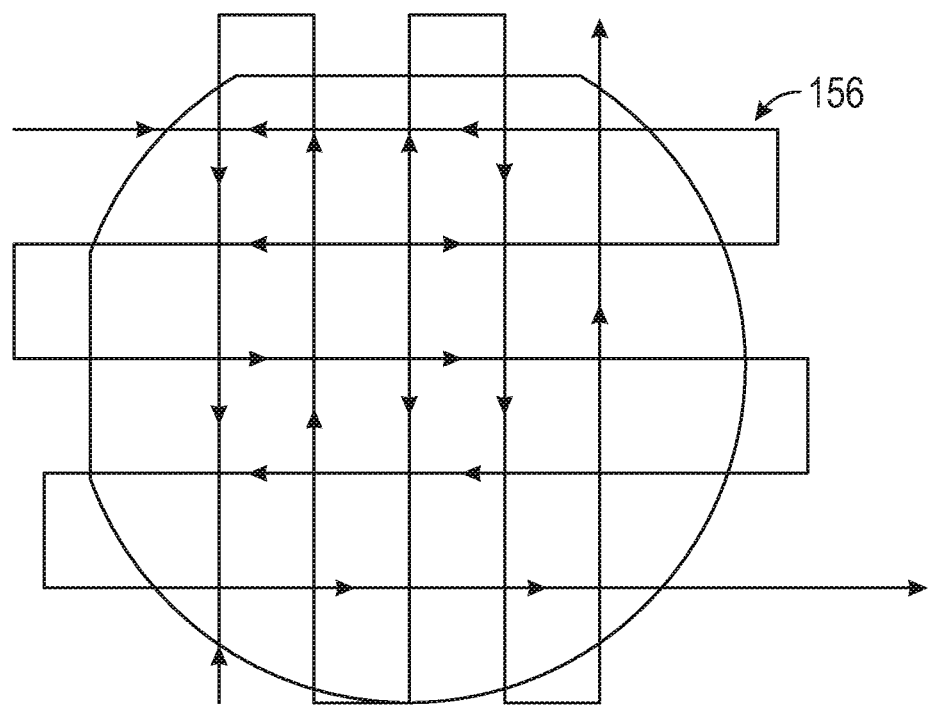
FIG. 11 is a diagram of a semiconductor substrate with an intersecting dual pass path illustrated thereon.

FIG. 11 is a diagram 156 of a semiconductor substrate with an intersecting dual pass path illustrated thereon. In this implementation, the dual pass may be conducted to form a single damage layer at one depth; in other implementations, one of the dual passes may be used to form the first damage layer and the other dual pass may be used to form the second damage layer. The intersecting substantially perpendicular passes here may assist with run rates and/or optical effects of forming a second damage layer in the substrate or boule where a first damage layer has already been formed.

Figure 12:
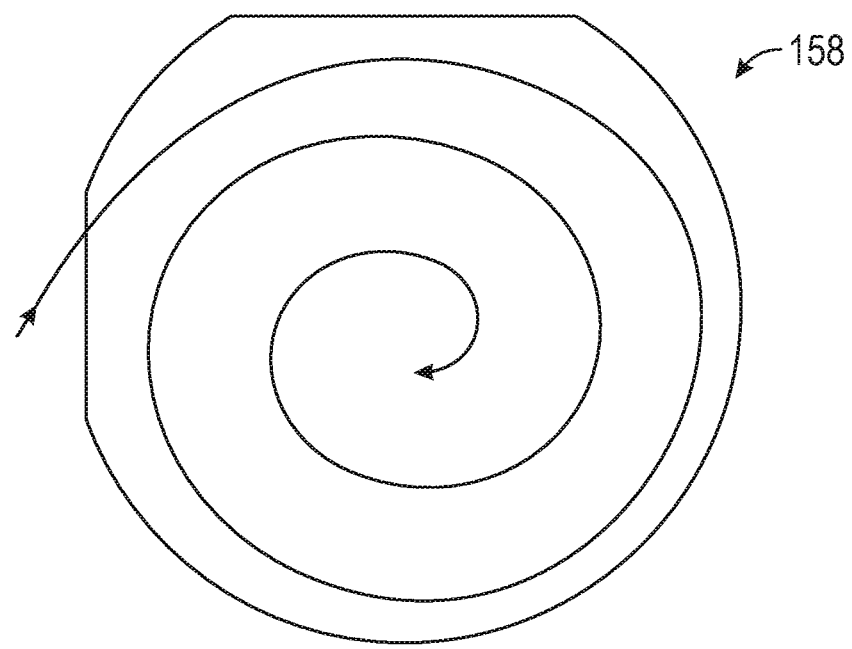
FIG. 12 is a diagram of a semiconductor substrate with a spiral single pass path illustrated thereon.

Referring to FIG. 12, a semiconductor substrate which has been processed using a single pass spiral path 158 is illustrated. In various implementations, various combinations and arrangements of spiral paths may be employed, such as multi-pass paths, and spirals of various shapes and designs (more tightly arranged spirals at the beginning or end of the spiral) and various overlapping arrangements of spirals may be used. Also, for spiral (and alternating/intersecting paths), the frequency of pulses of laser irradiation along the path may be varied along the path (more points at the beginning, middle, or end of the path, or in different portions of the path than in other portions). Also, where spiral paths are executed, they may be executed in reverse directions between formation of the first damage layer and formation of the second damage layer to aid in separation or improve process tool utilization rates.

Figure 13:
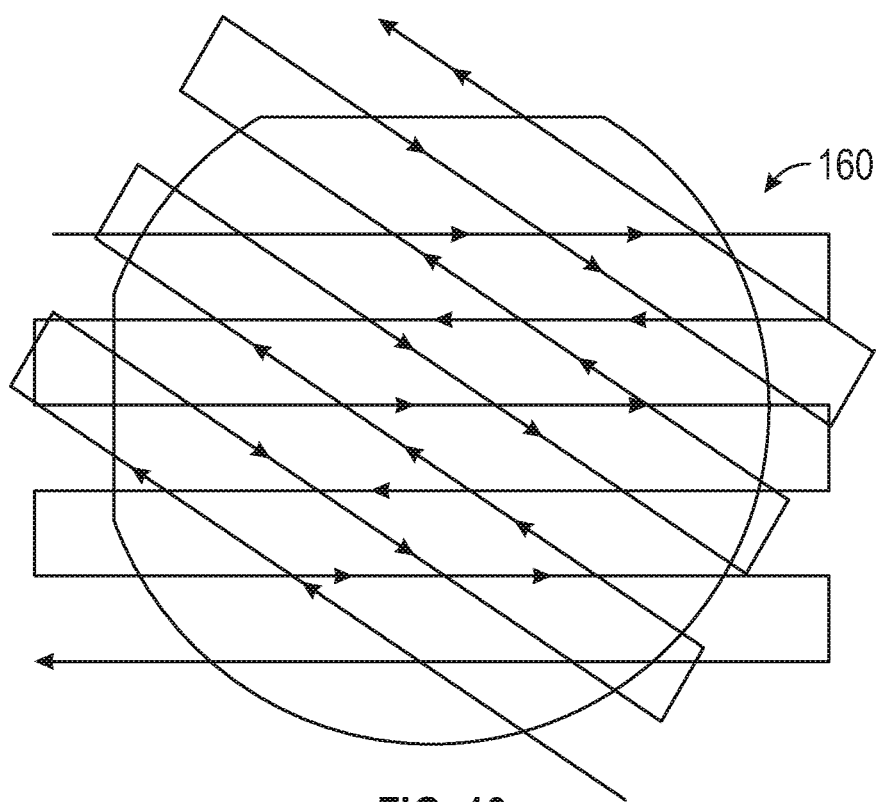
FIG. 13 is a diagram of a semiconductor substrate with an angled intersecting dual pass path illustrated thereon.

FIG. 13 illustrates another diagram of an intersecting dual pass path 160 where the second pass is angled rather than executed at about 90 degrees to the first pass. The angle at which the second pass is performed relative to the first pass may be determined by various factors, including, by non-limiting example, the orientation of crystallographic planes in the substrates, desired throughput rates through the laser process tool, desired crack positions in the damage layer, and any other process characteristic that affects the speed or efficacy of the laser treatment. Note that in FIG. 13 that some of the locations along the path of laser irradiation are common between the first pass and the second pass and other locations are unique to one of the passes. As previously described, the first pass may be used alone to form a first damage layer at a first depth and the second pass may be used alone to form a second damage layer at a second depth. In other implementations, both the first and second passes may be used to form each damage layer, however.

Figure 14:
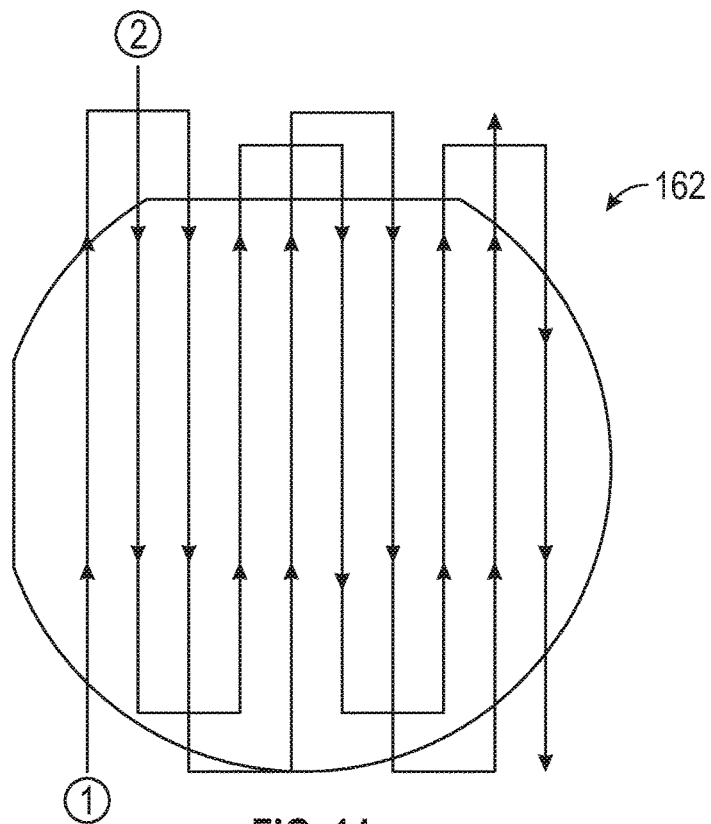
FIG. 14 is a diagram of a semiconductor substrate with a dual intersecting pass path illustrated thereon.

Referring to FIG. 14, a diagram 162 of another implementation of a dual intersecting pass path is illustrated. As illustrated, in this implementation, all of the locations along the second pass are oriented substantially parallel with the locations of the first pass and none are shared between the two passes. The use of this technique may, in various implementations, assist with spreading of cracks or other damage within the damage layer by allowing the substrate material to react to the damage of the first pass before the second modified layer of damage is created. This effect may be observed where the first pass and the second pass are used to form the same damage layer. As previously describe, the first pass may also be used to form a first damage layer at a first depth and the second pass used to form a second damage layer at a second depth.

Figure 15:
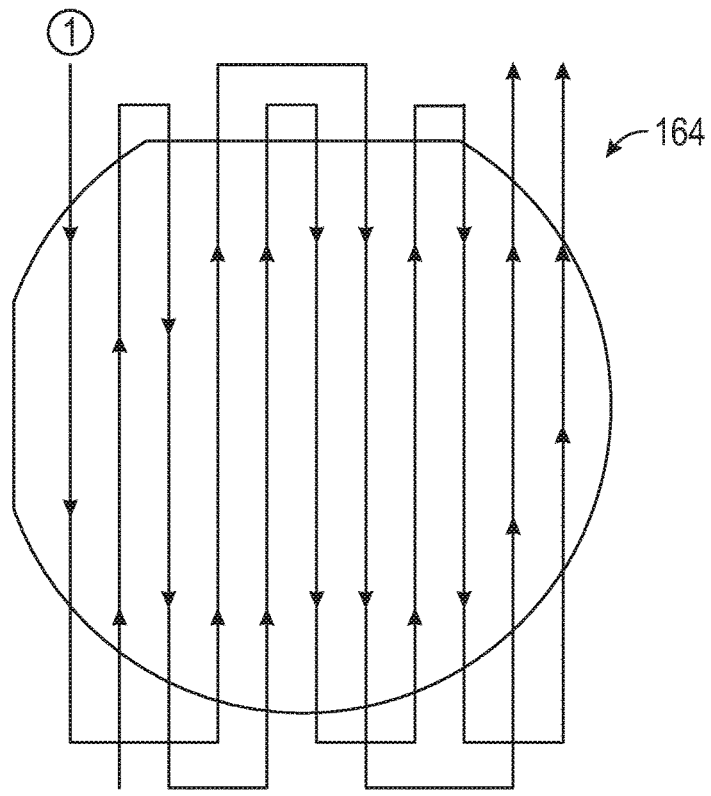
FIG. 15 is a diagram of a semiconductor substrate with another dual intersecting pass path illustrated thereon.

FIG. 15 illustrates a diagram of a dual intersecting pass path 164 which is executed in the reverse order from the path 162 illustrated in FIG. 14. In various implementations, the dual pass path may be executed in varying orders from substrate to substrate as the damage layer characteristics are not affected by the order of execution. In other implementations, the order in which the dual pass path is executed may affect the characteristics of the damage layer formed, so all substrates have to be executed in the same order. Where the damage layer characteristics depend on the execution order of the dual pass path, this may be caused by a wide variety of factors, including, by non-limiting example, the crystallographic planes of the substrate, the alignment of higher atomic weight atoms in one plane versus and other relative to the direction of execution of the dual pass paths, and any other material characteristics of the substrate and/or the laser light. Where the first and second passes of the dual intersecting path are used to form different damage layers, as described herein, the order of execution may also be used to help with tool run rates and/or optical effects using the same principles disclosed herein.

Many different single pass, dual pass, and more than two pass paths for processing semiconductor substrates may constructed using the principles disclosed in this document. Also, many different intersecting, spiral, alternating, alternating+spiral, random, and semi-random paths may be constructed using the principles disclosed herein. These paths may also be used in various combinations to form first, second, third, or additional damage layers prior to separation using ultrasonic energy as disclosed herein. What paths are employed will depend on many of the different laser and substrate material factors desired, as well as the desired characteristics of the damage layer for use in speeding the backgrinding process.

In places where the description above refers to particular implementations of semiconductor substrate manufacturing systems and related methods and implementing components, sub-components, methods and sub-methods, it should be readily apparent that a number of modifications may be made without departing from the spirit thereof and that these implementations, implementing components, sub-components, methods and sub-methods may be applied to other semiconductor substrate manufacturing systems and related methods.

What is claimed is:

1. A method of thinning a semiconductor substrate, the method comprising:
providing a semiconductor substrate having a first surface and second surface opposing the first surface, the semiconductor substrate having a thickness between the first surface and the second surface;
inducing damage into a portion of the semiconductor substrate at a first depth into the thickness forming a first damage layer;
inducing damage into a portion of the semiconductor substrate at a second depth into the thickness forming a second damage layer;
applying ultrasonic energy to the semiconductor substrate; and
separating the semiconductor substrate into three separate thinned portions across the thickness along the first damage layer and along the second damage layer using only the ultrasonic energy.

2. The method of claim 1, wherein the first surface includes a plurality of semiconductor devices formed therein.

3. The method of claim 1, further comprising backgrinding the three thinned separate portions on those surfaces of the three separate thinned portions that faced one of the first damage layer and the second damage layer.

4. The method of claim 1, wherein the semiconductor substrate is silicon carbide.

5. The method of claim 1, further comprising:
    inducing damage into a portion of the semiconductor substrate at a third depth into the thickness forming a third damage layer; and
    wherein separating the semiconductor substrate further comprises separating into separate thinned portions across the thickness along the first damage layer, along the second damage layer, and along the third damage layer.

6. The method of claim 1, wherein the first depth into the thickness is greater than the second depth.

7. The method of claim 1, wherein the second depth into the thickness is greater than the first depth.

8. A method of forming semiconductor substrates, the method comprising:
    providing a boule comprising a semiconductor material having a first surface thereon;
    inducing damage into a portion of the boule at a first depth into the boule from the first surface forming a first damage layer;
    inducing damage into a portion of the boule at a second depth into the boule from the first surface forming a second damage layer;
    applying ultrasonic energy to the boule; and
    separating semiconductor substrates from the boule along the first damage layer and along the second damage layer using only the ultrasonic energy.

9. The method of claim 8, further comprising backgrinding the semiconductor substrates on those surfaces of the semiconductor substrates that faced one of the first damage layer and the second damage layer.

10. The method of claim 8, wherein the boule comprises silicon carbide.

11. The method of claim 8, further comprising:
    inducing damage into a portion of the boule at a third depth into the boule from the first surface forming a third damage layer; and
    wherein separating semiconductor substrates further comprises separating semiconductor substrates along the first damage layer, along the second damage layer, and along the third damage layer.

12. The method of claim 8, wherein the first depth into the thickness is greater than the second depth.

13. The method of claim 8, wherein the second depth into the thickness is greater than the first depth.

14. A method of thinning a semiconductor substrate for reuse, the method comprising:
    providing a semiconductor substrate comprising a first surface and a second surface opposing the first surface, the semiconductor substrate having a thickness between the first surface and the second surface, the first surface including a plurality of semiconductor devices thereon;
    inducing damage into a portion of the semiconductor substrate at a depth into the thickness forming a damage layer;
    applying ultrasonic energy to the semiconductor substrate;
    separating the semiconductor substrate into two thinned portions across the thickness along the first damage layer using only the ultrasonic energy, a first one of the two thinned portions comprising the plurality of semiconductor devices; and
    forming one or more semiconductor devices on a second one of the two thinned portions.

15. The method of claim 14, further comprising backgrinding the two thinned portions on those surfaces of the two thinned portions that faced the first damage layer.

16. The method of claim 14, wherein the semiconductor substrate is silicon carbide.

17. The method of claim 14, wherein separating the semiconductor substrate further comprises applying bias force to one of the first surface, the second surface, and both the first surface and the second surface while one of applying ultrasonic energy to the semiconductor substrate and after applying ultrasonic energy to the semiconductor substrate.

18. The method of claim 14, further comprising:
    inducing damage into a portion of the second one of the two thinned semiconductor substrates at a depth into a thickness of the thinned semiconductor substrate forming a damage layer;
    applying ultrasonic energy to the second one of the two thinned semiconductor substrates;
    separating the second one of the two thinned semiconductor substrates into two thinned portions across the thickness along the damage layer, a first one of the two thinned portions comprising the plurality of semiconductor devices formed on the second one of the two thinned semiconductor substrates; and
    forming one or more semiconductor devices on a second one of the two thinned portions.

* * * * *